(12) United States Patent
Yamaguchi et al.

(10) Patent No.: US 7,079,379 B2
(45) Date of Patent: Jul. 18, 2006

(54) COOLING DEVICE HIGH VOLTAGE ELECTRICAL UNIT FOR MOTOR OF VEHICLE, AND HYBRID VEHICLE

(75) Inventors: Hiroo Yamaguchi, Utsunomiya (JP);
Hiroshi Ohtsuka, Utsunomiya (JP);
Osamu Hasegawa, Utsunomiya (JP);
Toshiyuki Matsuoka, Utsunomiya (JP);
Koshiro Fuchibe, Utsunomiya (JP);
Kunio Hasegawa, Kawachi-gun (JP);
Hiromitsu Sato, Kawachi-gun (JP)

(73) Assignee: Honda Motor Co., Ltd., Tokyo (JP)

( * ) Notice: Subject to any disclaimer, the term of this patent is extended or adjusted under 35 U.S.C. 154(b) by 59 days.

(21) Appl. No.: 10/994,374

(22) Filed: Nov. 23, 2004

(65) Prior Publication Data
US 2005/0111167 A1   May 26, 2005

(30) Foreign Application Priority Data
Nov. 26, 2003   (JP) .............................. 2003-395283
May 14, 2004   (JP) .............................. 2004-145239

(51) Int. Cl.
*H05K 7/20* (2006.01)

(52) U.S. Cl. ...................... 361/676; 361/695; 361/641; 180/68.5; 429/100

(58) Field of Classification Search ................ 361/600, 361/641, 643, 676, 679, 694–695; 180/68.1, 180/68.2, 68.3, 68.5, 65.2, 65.3, 65.1, 311, 180/312, 313; 429/61, 99, 100, 101, 120, 429/148, 151, 156, 159, 163; 320/104, 112, 320/138, 150, 153; 62/259.2, 186, 244, 239, 62/408, 409
See application file for complete search history.

(56) References Cited

U.S. PATENT DOCUMENTS

| | | | |
|---|---|---|---|
| 6,188,574 B1 * | 2/2001 | Anazawa ..................... | 361/695 |
| 6,315,069 B1 * | 11/2001 | Suba et al. ................ | 180/68.5 |
| 6,344,728 B1 * | 2/2002 | Kouzu et al. ............... | 320/116 |
| 6,379,837 B1 * | 4/2002 | Takahashi et al. .......... | 429/151 |
| 6,457,542 B1 * | 10/2002 | Hosono et al. ............. | 180/68.1 |
| 6,613,472 B1 * | 9/2003 | Watanabe ................... | 429/120 |
| 6,750,630 B1 * | 6/2004 | Inoue et al. ................ | 320/104 |
| 6,902,020 B1 * | 6/2005 | Kronner et al. ............ | 180/68.5 |
| 6,931,878 B1 * | 8/2005 | Kubota et al. ............. | 62/259.2 |
| 6,978,855 B1 * | 12/2005 | Kubota et al. ............. | 180/65.3 |
| 2005/0168180 A1 * | 8/2005 | Minekawa et al. ......... | 318/268 |

FOREIGN PATENT DOCUMENTS

JP   11-180169 A   7/1999

(Continued)

*Primary Examiner*—Michael Datskovskiy
(74) *Attorney, Agent, or Firm*—Arent Fox PLLC

(57) ABSTRACT

A cooling device for a high voltage electrical unit for a motor of a vehicle, includes: an inverter for controlling the motor that drives the vehicle; an electrical energy storing device for supplying electrical energy to the motor via the inverter; a downverter for decreasing source voltage of the electrical energy storing device, the downverter, the inverter, and the electrical energy storing device disposed under a seat of the vehicle in a concentrated manner; a fan, disposed under the seat, for moving cooling air to the electrical energy storing device and the inverter; an air inlet disposed under the seat and at an end of the seat as viewed in a width direction of the vehicle; and an air outlet disposed under the seat and at the other end of the seat as viewed in a width direction of the vehicle.

9 Claims, 11 Drawing Sheets

FOREIGN PATENT DOCUMENTS

| | | | |
|---|---|---|---|
| JP | 02000247157 A * | 9/2000 | |
| JP | 2001-233064 | 8/2001 | |
| JP | 2001-354039 A | 12/2001 | |
| JP | 2002-166728 A | 6/2002 | |
| JP | 2002-170601 A | 6/2002 | |
| JP | 2002-219949 A | 8/2002 | |
| JP | 2003-079003 | 3/2003 | |
| JP | 2003-112531 A | 4/2003 | |
| JP | 2003-300419 A | 10/2003 | |
| JP | 2003-306045 A | 10/2003 | |
| JP | 2003-341373 A | 12/2003 | |
| JP | 2004-268779 A | 9/2004 | |
| JP | 2004-291715 A | 10/2004 | |

* cited by examiner

COOLING DEVICE HIGH VOLTAGE ELECTRICAL UNIT FOR MOTOR OF VEHICLE, AND HYBRID VEHICLE

BACKGROUND OF THE INVENTION

1. Field of the Invention

The present invention relates to a cooling device for a high voltage electrical unit for a motor of a vehicle, which is provided for cooling the high voltage electrical unit (including an electrical energy storing device, an inverter, etc.) installed in a vehicle which is solely driven by a motor, or in a vehicle which is driven by an engine and a motor. The present invention also relates to a hybrid vehicle having the cooling device for a high voltage electrical unit for a motor of a vehicle.

Priority is claimed on Japanese Patent Applications Nos. 2003-395283, filed Nov. 26, 2003, and 2004-145239, filed May 14, 2004, the contents of which are incorporated herein by reference.

2. Description of Related Art

In a vehicle which is solely driven by a motor, or in a vehicle which is driven by an engine and a motor (hereinafter referred to as a hybrid vehicle), when electrical energy is supplied from a battery, which is a direct current power source, to a motor thereof, the direct current is converted into alternating current by an inverter. In the case of a hybrid vehicle, a portion of output power of the engine, or a portion of the kinetic energy of the vehicle, is charged, via the motor, into the battery after converting alternating current into direct current by an inverter.

A battery and an inverter (hereinafter, a high voltage power source including a battery and an inverter, and a high voltage electrical device are, in general, referred to as a high voltage electrical unit) emit heat during operations thereof. The charging and discharging efficiency of a battery may decrease due to high temperature. An inverter has a permissible high temperature, and the inverter may be damaged when the temperature thereof exceeds the permissible high temperature. By increasing the capacity of an inverter, the amount of heat emitted from the inverter can be reduced; however, increase in the capacity results in increase in the size and weight of the inverter, which is not preferable in view of installation of the inverter in a vehicle because it is required for an inverter, which is to be installed in a vehicle, to be as small as possible. Accordingly, an inverter must be cooled.

As explained above, for a vehicle including such a high voltage electrical unit, it has been an important object how to efficiently cool the high voltage electrical unit within a limited installation space, and various attempts have been made to achieve such an object (see, for example, Japanese Unexamined Patent Application, First Publications Nos. 2003-79003 and 2001-233064).

However, in the technology disclosed in Japanese Unexamined Patent Application, First Publication No. 2003-79003, because a high voltage electrical unit is installed behind a rear seat, problems are encountered in that the rear seat cannot be folded, the size of a luggage compartment is limited, a point at which the high voltage electrical unit is connected to a structural body part is located far, long lines from a motor are required, a countermeasure for a rear impact must be considered, etc.

Moreover, in the technology disclosed in Japanese Unexamined Patent Application, First Publication No. 2001-233064, because a high voltage electrical device and a high voltage power source are separately disposed, a problem is encountered in that two cooling systems are required.

Furthermore, when a high voltage power source is installed under a floor, as another technology other than those disclosed in Japanese Unexamined Patent Application, First Publication Nos. 2003-79003 and 2001-233064, problems are encountered in that upper surfaces of seats are located at a high position in order to ensure a minimum ground clearance, the passenger may feel that there is a lack of head clearance and uneasiness in getting in and out, a perfect sealing structure with respect to the passenger compartment must be considered, protection against heat of the exhaust system must be considered in the case of a hybrid vehicle, etc.

As explained above, a vehicle provided with a high voltage electrical unit may have degraded utility because the size of the vehicle cannot be significantly increased when compared with an ordinal gasoline vehicle.

SUMMARY OF THE INVENTION

In consideration of the above circumstances, an object of the present invention is to efficiently cool down a high voltage electrical unit without degrading utility of the vehicle.

In order to achieve the above object, the present invention provides a cooling device for a high voltage electrical unit for a motor of a vehicle, including: an inverter for controlling the motor that drives the vehicle; an electrical energy storing device for supplying electrical energy to the motor via the inverter; a downverter for decreasing source voltage of the electrical energy storing device, the downverter, the inverter, and the electrical energy storing device disposed under a seat of the vehicle in a concentrated manner; a fan, disposed under the seat, for moving cooling air to the electrical energy storing device and the inverter; an air inlet disposed under the seat and at an end of the seat as viewed in a width direction of the vehicle; and an air outlet disposed under the seat and at the other end of the seat as viewed in a width direction of the vehicle.

According to the above structure, when the fan rotates, cooling air in the passenger compartment flows under the seat from a position under the seat and at an end of the seat as viewed in the width direction of the vehicle toward the other end of the seat as viewed in the width direction. During the cooling operation, heat is exchanged between the cooling air and the electrical energy storing device, the inverter, and the downverter which are disposed in a concentrated manner under the seat.

The above cooling device may further include: a first heat sink fixed to the inverter; and a second heat sink fixed to the downverter, and disposed so as to oppose the first heat sink. The electrical energy storing device may be disposed upstream of a cooling air flow, and the inverter and the downverter may be disposed downstream of the cooling air flow.

According to the above structure, the electrical energy storing device, whose control temperature is relatively low among those of the high voltage electrical devices such as the electrical energy storing device and the inverter which are disposed in a concentrated manner, is first cooled, and then the inverter and the downverter, which tend to have a temperature higher than the control temperature of the electrical energy storing device, are cooled at one time; therefore, efficiency of heat exchange can be improved.

In the above cooling device, the electrical energy storing device may include modules which have electrical energy storing modules which are disposed in parallel while having gaps therebetween, and each of which includes cells connected in series, and air flow apertures disposed above and below the modules. Moreover, the cooling device may further include an air flow duct for allowing cooling air to flow from one of the air flow apertures to the first heat sink and the second heat sink, and the air flow duct may be formed by connecting an upper duct and a lower duct.

According to the above structure, the cooling air having flowed into the electrical energy storing device from the upper (or lower) air flow aperture flows out of the electrical energy storing device through the lower (or upper) air flow aperture while exchanging heat with the modules. The cooling air having flowed out is led along the lower duct of the air flow duct to the heat sinks which are provided on the inverter and the downverter.

In the above cooling device, the electrical energy storing device, the inverter, the downverter, and the fan may be integrally fixed to a single loop-shaped frame.

According to the above structure, because the high voltage electrical devices such as the electrical energy storing device and the inverter are disposed in a concentrated manner, only one cooling system is required, and it is easy to install the cooling device for a high voltage electrical unit on the body of the vehicle.

In the above cooling device, the electrical energy storing device may include: air flow aperture panels which are disposed at an upper portion and lower portion thereof; modules which comprise electrical energy storing modules which are disposed in parallel while having gaps therebetween, and each of which comprises cells connected in series; and side retaining panels which retain side surfaces of the modules. The air flow aperture panels and the side retaining panels may be fixed to the frame by co-tightening.

According to the above structure, some of the fasteners such as bolts that are required for sub-assembling the electrical energy storing device in advance can be made common with fasteners that are required for fixing the electrical energy storing device, which is sub-assembled in advance, to the frame.

In the above cooling device, the frame may include a first fixing portion by which the frame is fixed to the body of the vehicle, and a second fixing portion by which the electrical energy storing device, the inverter, the downverter, and the fan are fixed to the frame.

According to the above structure, the high voltage electrical devices such as the electrical energy storing device and the inverter which are fixed to the frame via the second fixing portion can be, with the frame, installed on the vehicle body via the first fixing portion.

The above cooling device may further include: a first heat sink fixed to the inverter; and a second heat sink fixed to the downverter, and be disposed so as to oppose the first heat sink, and the frame may be routed through a position under the electrical energy storing device, side positions of the first heat sink and the second heat sink, and a position under the fan.

According to the above structure, the inverter and the downverter do not project downward from the frame, and the lower surface of the high voltage electrical unit can be made flat even though the inverter and the downverter are fixed to the frame in such a manner that the heat sinks thereof oppose each other, as in the case in which the frame is formed to be flush.

In the above cooling device, terminals of the downverter and terminals of the electrical energy storing device may be disposed close to each other, and the terminals may be connected to each other via a plate-shaped conductive member.

According to the above structure, inductance and resistance can be reduced.

The present invention further provides a hybrid vehicle which is driven by transmitting at least one of driving powers of an engine and a motor to driving wheels of the vehicle, the hybrid vehicle including: a fuel tank, disposed under a front seat of the hybrid vehicle, for storing fuel to be supplied to the engine; and the cooling device for a high voltage electrical unit for a motor of a vehicle mentioned above, which is disposed under a rear seat of the hybrid vehicle.

According to the above structure, in the hybrid vehicle, the seatback of the rear seat can be tilted down so that the passenger compartment and the luggage compartment are connected to each other.

According to the present invention, because the high voltage electrical devices such as the electrical energy storing device and the inverter which are disposed under the seat in a concentrated manner, a so-called trunk-through configuration can be employed, and degradation of utility can be avoided. Moreover, because the high voltage electrical devices are not disposed in the luggage compartment or under the floor, a luggage compartment and a leg room of sufficient size can be ensured. Furthermore, because the high voltage electrical devices are disposed in the passenger compartment, the upper surfaces of the seats will not be located at a high position, and the passenger will not feel that there is a lack of head clearance even though a minimum ground clearance is ensured.

In addition, because the high voltage electrical devices such as the battery, which is a high voltage power source, and the inverter, are disposed, with the fan, on the single frame in a concentrated manner, the cooling systems can be unified, and thus a lower cost can be achieved.

Moreover, according to the present invention, in the hybrid vehicle, the seatback of the rear seat can be tilted down so that the passenger compartment and the luggage compartment are connected to each other.

DETAILED DESCRIPTION OF THE INVENTION

The best modes of the present invention will be explained below with reference to FIGS. 1 to 16.

The vehicle in the following embodiments is a hybrid vehicle which is driven by transmitting at least one of driving powers of an engine and a motor to driving wheels of the vehicle.

In the following description, the terms such as front, rear, right, and left are defined such that the direction along which the vehicle advances is defined as a forward direction.

Figure 1:
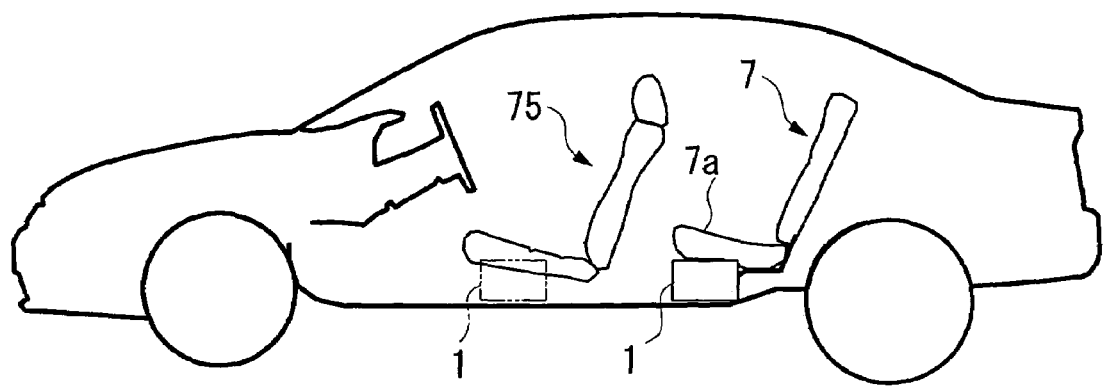
FIG. 1 is a diagram showing an installation position of a cooling device for a high voltage electrical unit according to the present invention in a vehicle.
Figure 2:
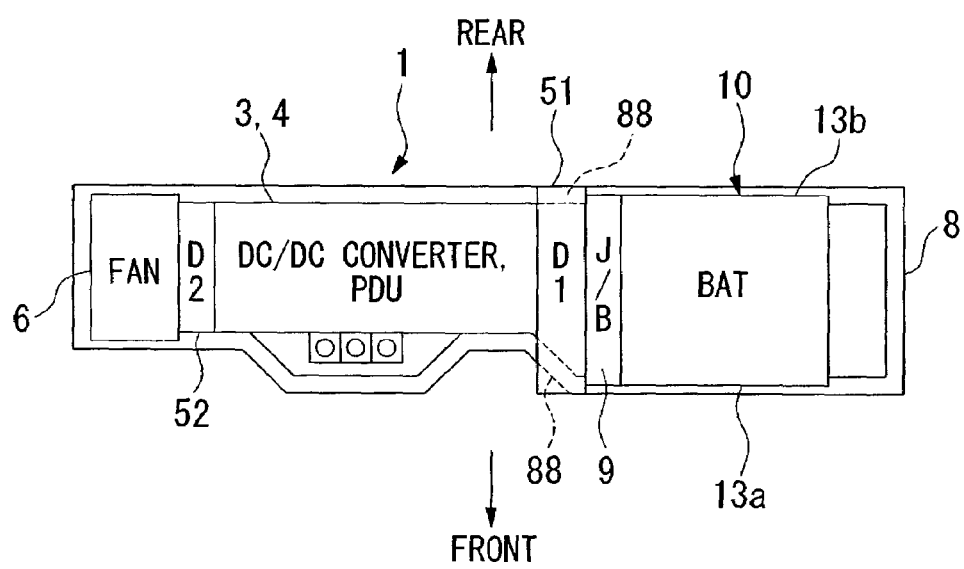
FIG. 2 is a schematic diagram showing the structure of the cooling device for a high voltage electrical unit.

As shown in FIG. 1, a cooling device 1 for a high voltage electrical unit in this embodiment is installed under a rear seat 7 in such a manner that the longitudinal direction of the cooling device 1 coincides with a width direction of the vehicle. As shown in a schematic diagram in FIG. 2, the cooling device 1 includes a PDU 3 (an inverter) for controlling a motor 2 for driving the vehicle, a battery 10 (an electrical energy storing device) for supplying electrical energy to the motor 2 via the PDU 3, a DC/DC converter 4 (a downverter) for decreasing a source voltage of the battery 10, a fan 6 for moving cooling air to high voltage electrical devices such as the battery 10, the DC/DC converter 4, and the PDU 3, a first air flow duct 51 for allowing the cooling air to flow from air flow apertures 18 of the battery 10 to upstream portions (inlet portions) of heat sinks 31 and 41, a second air flow duct 52 for allowing the cooling air to flow from downstream portions (outlet portions) of the heat sinks 31 and 41 to a suction region of the fan 6, and a frame 8 to which all of the aforementioned elements are integrally fixed.

Figure 10:
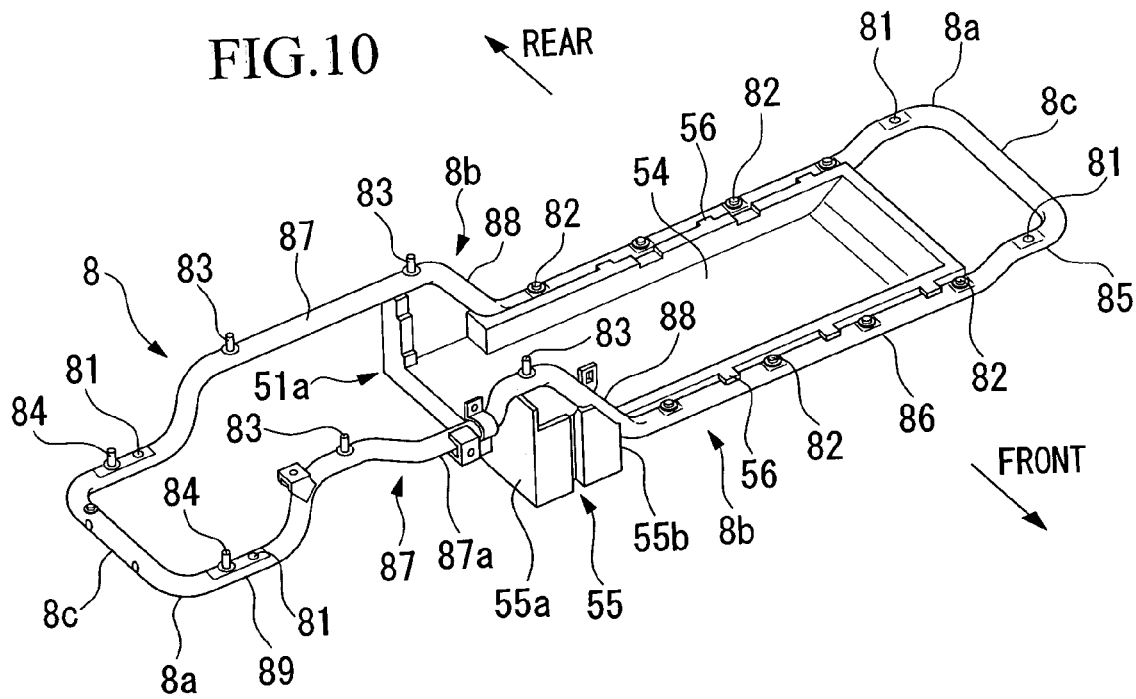
FIG. 10 is a perspective view showing a state in which a lower duct is fixed to a frame.

As shown in FIG. 10, the frame 8 is formed in a single closed loop shape in which each of four corners 8a is made to be a quarter arc as viewed in plan view. The frame 8 is provided with first female threads 81 (first fixing portions) for fixing the frame 8 to a vehicle body 71, and second female threads 82 (second fixing portions) and male threads 83 and 84 (second fixing portions) for fixing the battery 10, the PDU 3, the DC/DC converter 4, the fan 6, the first air flow duct 51, and the second air flow duct 52 to the frame 8. More specifically, the first male threads 81, and the second female threads 82 for fixing the battery 10 to the frame 8 are provided on substantially a left half portion (a right half portion as viewed in FIG. 10) of each of long sides 8b of the frame 8 from one of short sides 8c to the center of the frame 8 while having spaces therebetween in the longitudinal direction of the frame 8.

On the other hand, the male threads 83 for fixing the PDU 3 and the DC/DC converter 4, the first female threads 81 for fixing the frame 8 to the vehicle body 71, and male threads 84 for fixing the fan 6 are provided on substantially a right half portion (a left half portion as viewed in FIG. 10) of each of the long sides 8b of the frame 8 from the center of the frame 8 to the other of short sides 8c while having spaces therebetween in the longitudinal direction of the frame 8.

The long sides 8b includes bumps and dents along a direction from one of the short sides 8c to which the battery is fixed to the other of the short sides 8c, which is made shorter than one of the short sides 8c and to which the fan 6 is fixed.

More specifically, the long sides 8b extend diagonally downward from a left end portion (hereinafter referred to as a left body fixing portion 85) in which the first female threads 81 for fixing the frame 8 to the body 71 are formed, and extend to a portion (hereinafter referred to as a battery fixing portion 86) in which the second female threads 82 for fixing the battery 10 are formed. The long sides 8b further extend diagonally upward from a right end portion of the battery fixing portion 86, i.e., from substantially a center of the frame 8 in the longitudinal direction thereof, and extend to a portion (hereinafter referred to as a PDU fixing portion 87) on which the male threads 83 for fixing the PDU 3 and the DC/DC converter 4 are formed. Rising portions 88 (upward extending portions) are to be accommodated in the first air flow duct 51. As shown in a schematic view in FIG. 2, one of the rising portions 88 that is disposed forward (bottom side as viewed in FIG. 10) is bent so as to extend toward the inside as viewed in plan view, i.e., toward the other of the rising portions 88 that is disposed backward, as it extends upward.

Referring to FIG. 10 again, in the PDU fixing portion 87 and between the male threads 83 which are disposed separately from each other in the longitudinal direction of the frame 8, there is formed an expanding portion 87a which horizontally expands outward (expands forward in a direction along which the short side extend) in order to avoid interference with a terminal fixing portion 32 of the PDU 3 (see FIG. 9) when the PDU 3 is fixed to the frame 8.

The frame 8 further extends substantially vertically downward from a right end portion of the PDU fixing portion 87 to a level that substantially coincides with the left body fixing portion 85, and extends to a portion (hereinafter referred to as a fan fixing portion 89) on which the male threads 84 for fixing the fan 6 are formed. The fan fixing portion 89 is connected to one of the short sides 8c that is made shorter than the other.

After fixing the high voltage electrical devices such as the battery 10 and the PDU 3 to the frame 8 (FIG. 4), the frame 8 is routed through a position under the battery 10, side positions of the heat sinks 31 and 41, and a position under the fan 6. The battery 10, the first air flow duct 51, the PDU 3, the DC/DC converter 4, the second air flow duct 52, and the fan 6 are arranged in line in this order as viewed in plan view shown in FIG. 2 and as viewed in front view shown in FIG. 3.

Moreover, because the cooling air in the passenger compartment flows along the width direction of the vehicle from the battery 10 to the fan 6, the battery 10 is disposed upstream of flow of the cooling air, and the PDU 3 and the DC/DC converter 4 are disposed downstream of flow of the cooling air.

Figure 4:
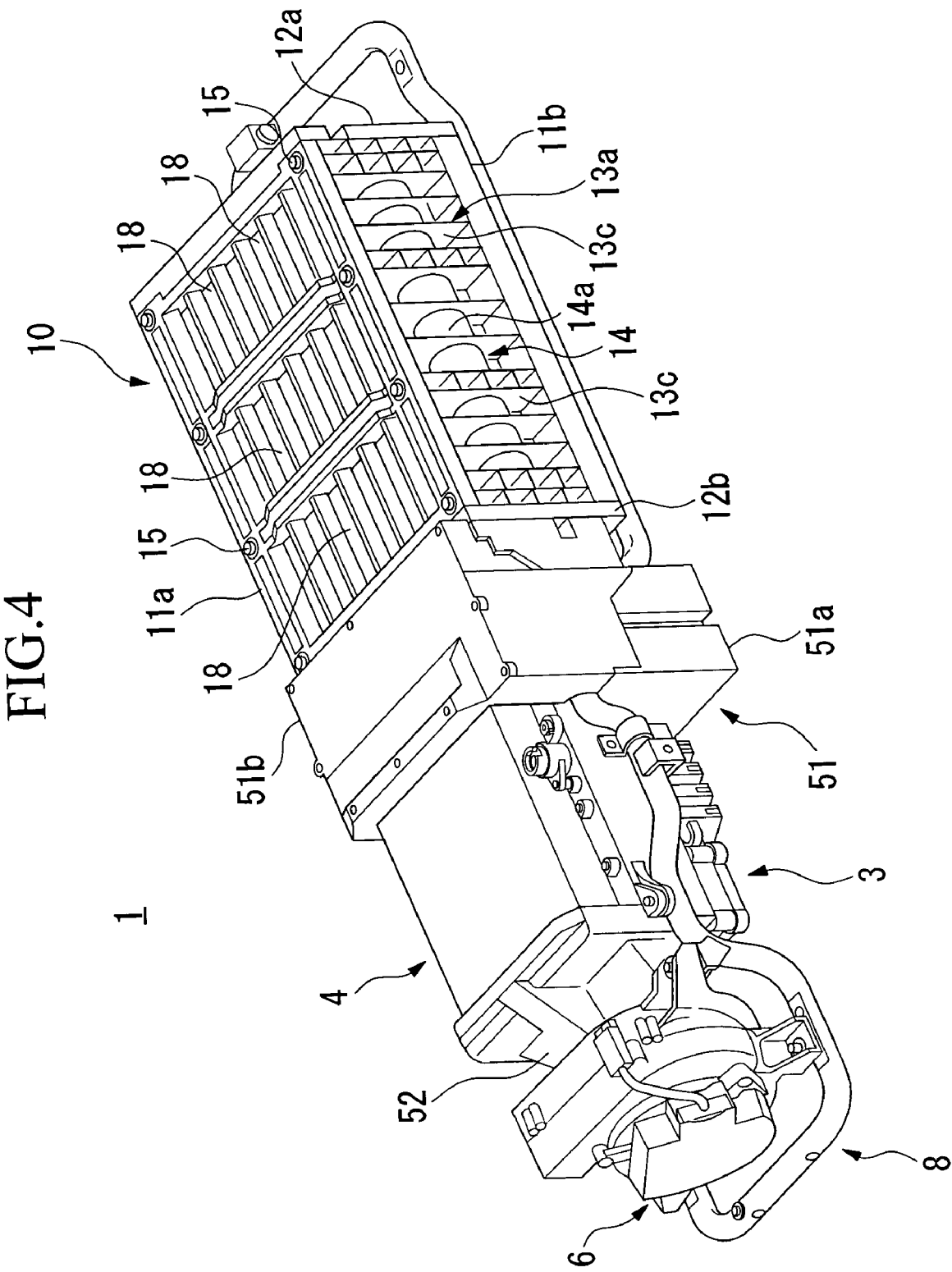
FIG. 4 is a perspective view showing an embodiment of the cooling device for a high voltage electrical unit.
Figure 6:
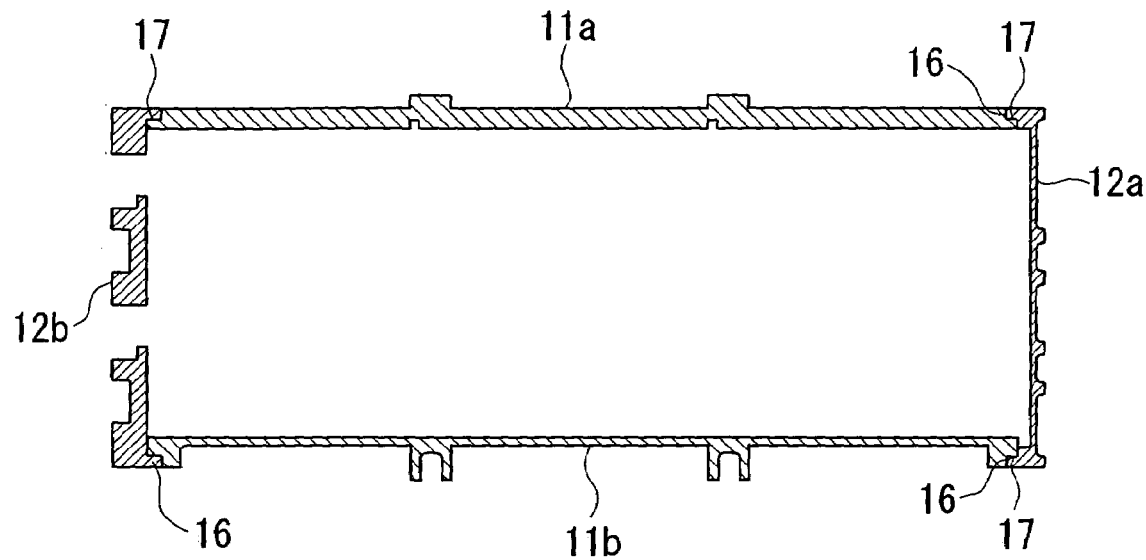
FIG. 6 is a cross sectional view showing the battery in a sub-assembled state.

As shown in FIGS. 4 and 6, the battery 10 includes: a battery box, which is formed as a box having an upper surface portion 11a (an upper air flow aperture panel), a lower surface portion 11b (a lower air flow aperture panel), right and left side surface portions 12a and 12b, a front surface portion 13a (a side retaining panel), and a rear surface portion 13b (a side retaining panel), which are assembled in a detachable manner; and modules 14 accommodated in the battery box. The modules 14 include electrical energy storing modules 14a, each of which includes cells connected in series, and which are fixed with a grommet so as to be disposed in parallel and in a zigzag manner while having gaps therebetween.

The front surface portion 13a and the rear surface portion 13b include side retaining portions 13c which press and hold outer surfaces, which are arranged in a direction along which the electrical energy storing modules 14a are connected in series, of the modules 14 at plural locations that are separated from each other in the direction of series connection.

The battery 10 is sub-assembled in advance, and is then fixed to the frame 8. Because the upper surface portion 11a, the lower surface portion 11b, the front surface portion 13a, and the rear surface portion 13b are fixed to the frame 8 in a co-tightening manner by bolts 15 which vertically penetrate through these elements, the number of fastening parts and workload required for the sub-assembly process are reduced.

More specifically, as shown, for example, in FIG. 6, the upper surface portion 11a, the lower surface portion 11b, the right and left side surface portions 12a and 12b, the front surface portion 13a, and the rear surface portion 13b are sub-assembled, without using fasteners such as bolts, by sandwiching the front surface portion 13a and the rear surface portion 13b between the upper surface portion 11a and the lower surface portion 11b in the vertical direction, and engaging engagement fingers 16 formed in the right and left side surface portions 12a and 12b with engagement recesses 17 correspondingly formed in the upper surface portion 11a and the lower surface portion 11b. Fixing between the surface portions 11a to 13b and fixing to the frame 8 are simultaneously performed by co-tightening the upper surface portion 11a, the lower surface portion 11b, the front surface portion 13a, and the rear surface portion 13b to the frame 8.

Plural air flow apertures 18 are formed in the upper surface portion 11a and the lower surface portion 11b. When the fan 6 rotates, cooling air flows into the battery 10 through the air flow apertures 18 that are formed at the upper surface of the battery 10. The cooling air flows through the battery 10 in the thickness direction thereof (i.e., from the upper surface portion 11a to the lower surface portion 11b), and flows to the PDU 3 and the DC/DC converter 4 through a lower duct 51a of the first air flow duct 51.

A battery protective function unit 9, in which battery protection elements such as a main switch 121, a main fuse 122, a battery current sensor 124 for detecting over-current, and a contactor 123 for shutting off an output circuit of the battery 10 when over-current is detected, are mounted on a base plate 20 in a concentrated manner, is fixed to a right side surface of the battery 10, i.e., to the side surface portion 12b that faces the PDU 3 and the DC/DC converter 4.

Figure 5:
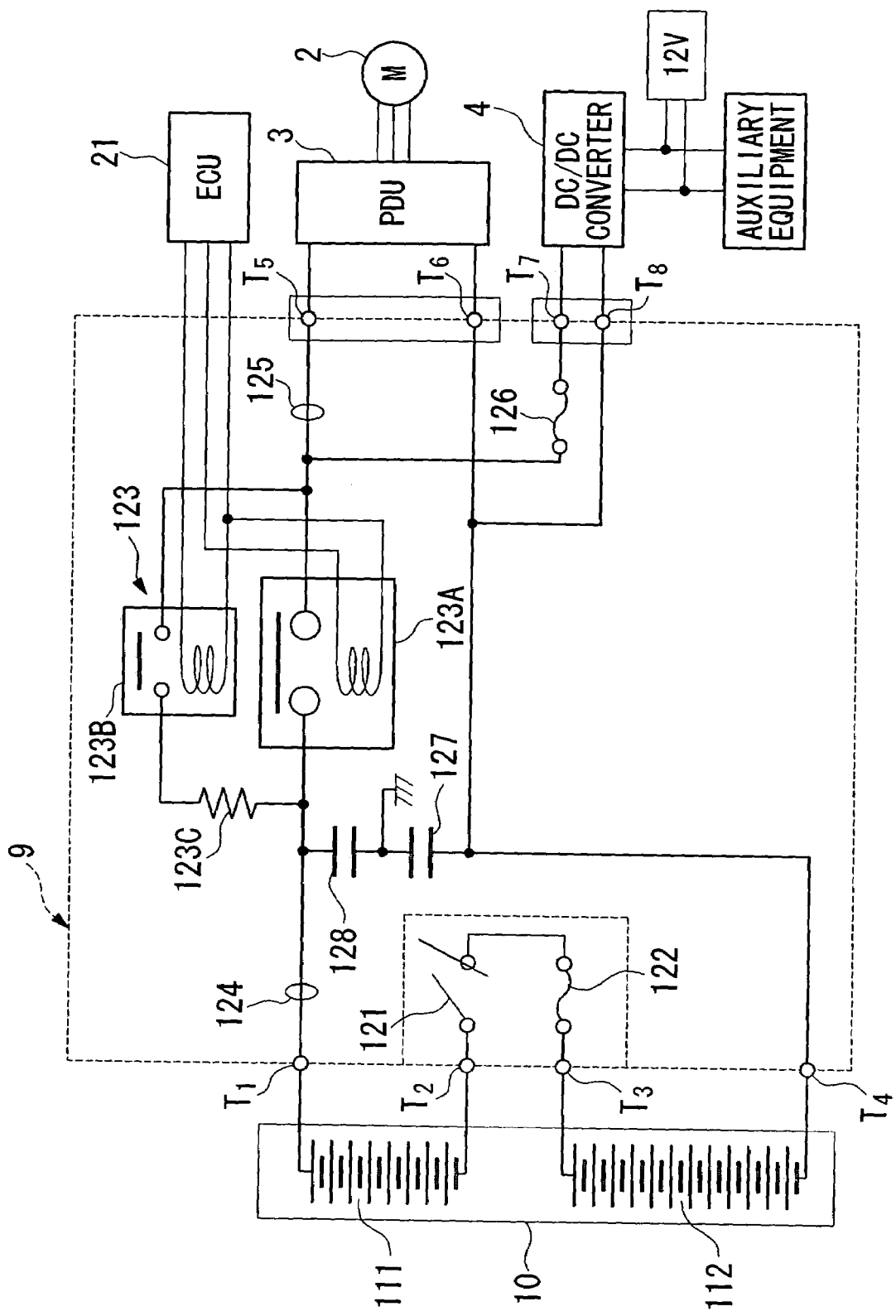
FIG. 5 is a circuit diagram of a battery protective function unit.

In the circuit diagram of the battery protective function unit 9 shown in FIG. 5, the battery 10 includes a first module portion (57.6 volts) 111 and a second module portion (86.4 volts) 112. The first module portion 111 and the second module portion 112 are connected to each other in series via the main switch 121 and the main fuse 122 which are disposed on the base plate 20.

The base plate 20 and each of the first module portion 111 and the second module portion 112 are connected to each other via terminal sections T1 to T4. On the other hand, the base plate 20 and each of the PDU 3 and the DC/DC converter 4 are connected to each other via terminal sections T5 to T8.

Terminals 22 and 23 of the battery 10, which are supported on the base plate 20, terminals 24 and 25 of the PDU 3, and terminals 26 and 27 of the DC/DC converter 4 are disposed close to each other. The terminal 22 and the terminals 24 and 26 are connected by a bus-plate 28, and terminal 23 and the terminals 25 and 27 are connected by a bus-plate 29.

The terminal section T5 includes terminals 22 and 24 and the bus-plate 28 connecting these terminals, and the terminal section T6 includes terminals 23 and 25 and the bus-plate 29 connecting these terminals. The terminal section T7 includes terminals 22 and 26 and the bus-plate 28 connecting these terminals, and the terminal section T8 includes terminals 23 and 27 and the bus-plate 29 connecting these terminals.

The contactor 123 is provided between the plus terminal section T1 for the battery 10 and the terminal section T5 for the PDU 3. The contactor 123 opens and closes a high voltage circuit, as well as protecting the high voltage circuit from over-current. The contactor 123 includes a main contactor 123A and a pre-charge contactor 123B connected to each other in parallel, and a pre-charge resistor 123C.

The battery current sensor 124 for measuring electrical current flowing from the battery 10 is provided between the terminal section T1 and the contactor 123. A PDU current sensor 125 for measuring electrical current flowing into the PDU 3 is provided between the contactor 123 and the terminal section T5. Moreover, a DC/DC converter fuse 126 for protecting the DC/DC converter 4 from short-circuit is provided between the contactor 123 and the terminal section T7.

The minus terminal section T4 for the battery 10, the terminal section T6 for the PDU 3, and the terminal section T8 for the DC/DC converter 4 are grounded via a condenser 127 in order to reduce radio noise. Similarly, the terminal section T1 is grounded via a condenser 128.

The main switch 121 and the main fuse 122 are connected between the terminal section T2 and the terminal section T3. The main switch 121 controls connection to the battery 10, and the main switch 121 is manually placed in the OFF state during maintenance.

In the circuit constructed as explained above, when the battery 10 is to be connected to the PDU 3 and the DC/DC converter 4, the main switch 121 is placed in the ON state. After the main switch 121 is placed in the ON state, by receiving a command from a battery ECU 21, the pre-charge contactor 123B is placed in the ON state, and a pre-charge circuit is closed. The electrical current flowing through the pre-charge circuit is limited by the pre-charge resistor 123C. Consequently, by receiving a command from the battery ECU 21, the main contactor 123A is placed in the ON state, and a main circuit is closed.

As a result, because the electrical current flowing through the pre-charge circuit is limited, fusion of the main contactor 123A is prevented.

As shown in FIG. 4, the first air flow duct 51 is formed in an integrated duct structure in which the lower duct 51a and an upper duct 51b, which can be assembled and disassembled, are included. When the lower duct 51a and the upper duct 51b are integrally assembled with the frame 8, the battery protective function unit 9 is surrounded by the ducts, and thus a cooling air flow path, which extends from the lower air flow apertures 18 to the first heat sink 31 and the second heat sink 41, is ensured.

The lower duct 51a includes a lower portion 54, which closes a lower space of the battery 10 and a gap portion 53 extending from the battery protective function unit 9 to the PDU 3 and the DC/DC converter 4, and a vertical wall 55 which surrounds the gap portion 53 with the upper duct 51b (FIG. 10).

The lower portion 54 is formed in substantially a box shape, and an upper surface of a long side thereof is provided with engagement fingers 56 having spaces therebetween, which are engageable with an upper surface of the battery fixing portion 86.

The vertical wall 55 covers side portions and right and rear portions of the gap portion 53, with the upper duct 51b. In the upper portions of a vertical wall 55a, which covers the right portion of the gap portion 53, and a vertical wall 55b, which faces the vertical wall 55a, and which covers the right portion of the gap portion 53, there are formed concave portions in shapes corresponding to peripheral shape of the frame 8. Corresponding to the concave portions, another concave portion is formed in the lower portion of the upper duct 51b so that the rising portion 88 of the frame 8 is sandwiched and accommodated between the concave portions when the lower duct 51a and the upper duct 51b are assembled with the frame 8. The mating surface between the lower duct 51a and the upper duct 51b is sealed by employing, for example, a labyrinth effect.

As explained above, because the rising portion 88 of the frame 8 is bent so as to extend toward the inside as viewed in plan view, most of the rising portion 88 is accommodated in the first air flow duct 51.

The PDU 3, which is mainly constituted by an inverter circuit, is a power drive unit as a motor control section. When electrical energy is supplied from the battery 10, which is a direct current power source, to the motor 2, the direct current is converted into alternating current by the PDU 3, and when a portion of output power of the engine, or a portion of the kinetic energy of the vehicle, is charged, via the motor 2, into the battery 10, the alternating current is converted into direct current by the PDU 3.

Because the direct current converted by the PDU 3 is of high voltage, the voltage of a portion thereof is decreased by the DC/DC converter 4.

Figure 8:
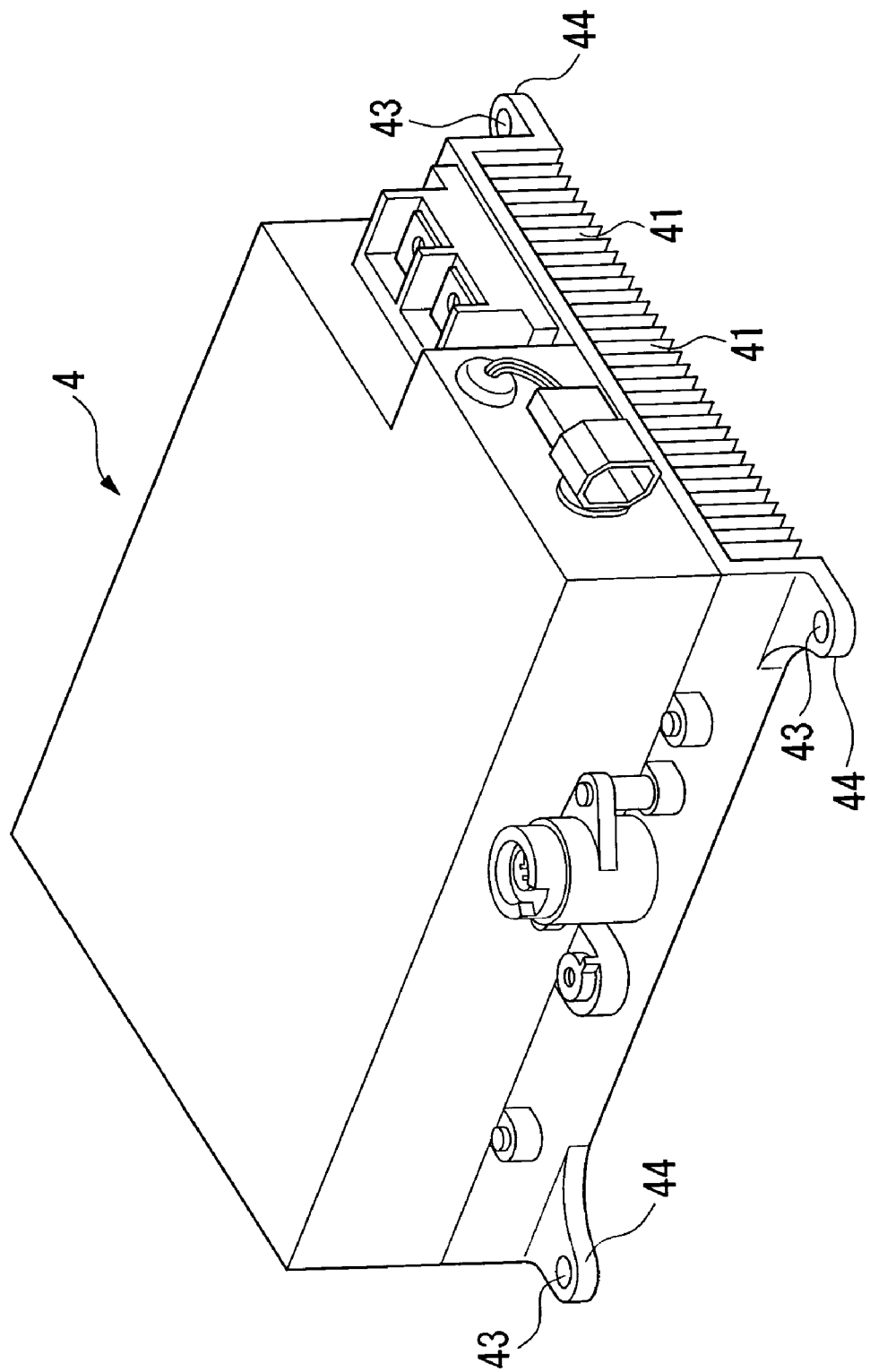
FIG. 8 is a perspective view of a DC/DC converter.
Figure 9:
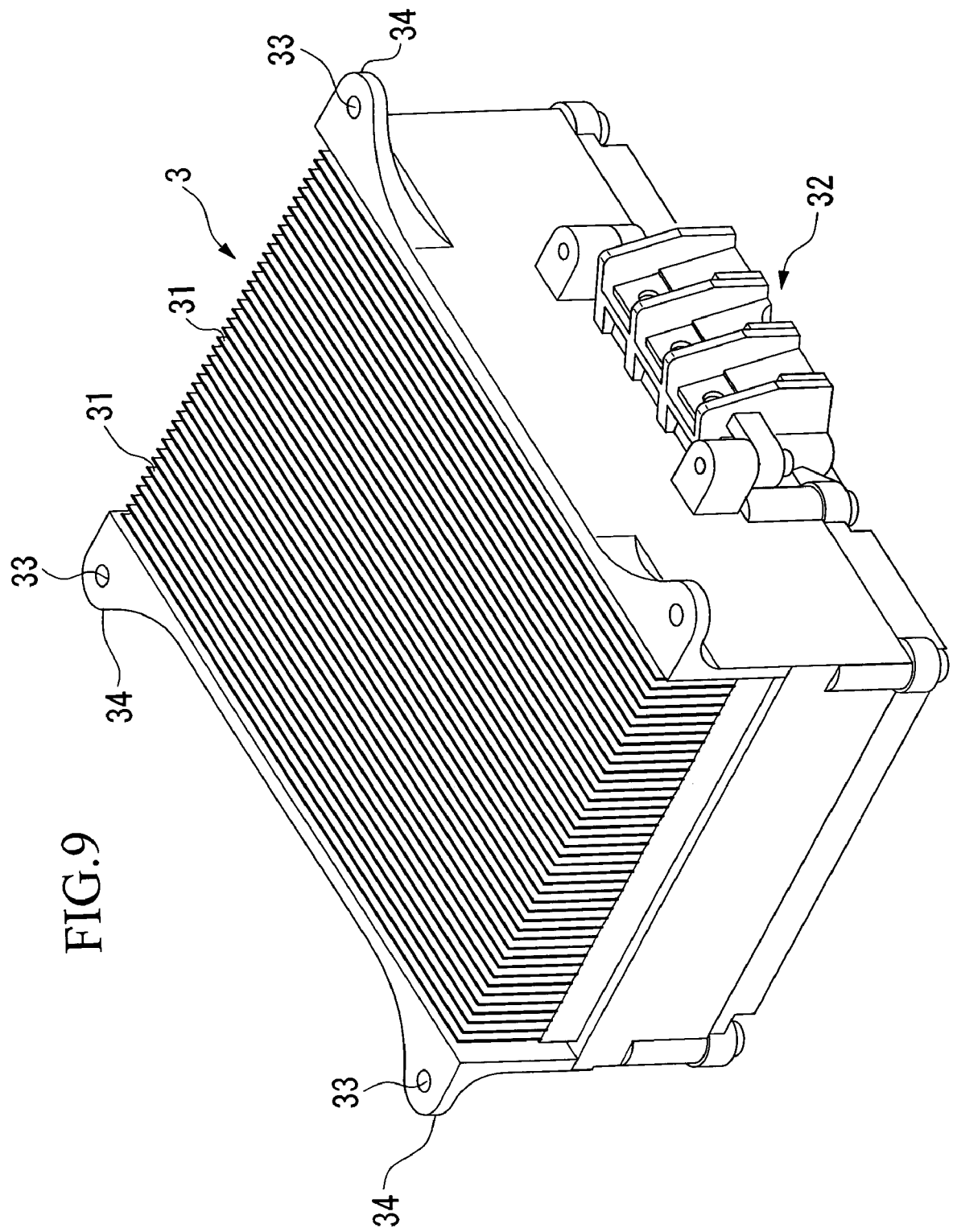
FIG. 9 is a perspective view of a PDU.

As shown in FIGS. 8 and 9, the heat sinks 31 and 41 are integrally fixed to the PDU 3 and the DC/DC converter 4, respectively. Near the four corners of the distal end of the heat sink 31, there are formed flanges 34, each of which has an insertion hole 33 therein. Near the four corners of the distal end of the heat sink 41, there are formed flanges 44, each of which has an insertion hole 43 therein. The PDU 3 and the DC/DC converter 4 are fixed to the frame 8 by inserting the male threads 83 formed on the PDU fixing portion 87 into the insertion holes 33 and 43, and by co-tightening using nuts.

Because the rising portions 88 are formed in the frame 8 in a curved manner, the PDU 3 does not project downward from the battery fixing portion 86 and the fan fixing portion 89. Accordingly, the lower surface of the cooling device 1 for a high voltage electrical unit, i.e., a mounting surface thereof to the vehicle body 71 is made substantially flush.

According to the above structure, the heat sink 31 of the PDU 3 and the heat sink 41 of the DC/DC converter 4 are disposed so as to face each other while having a gap therebetween, and the cooling air moving through the heat sinks 31 and 41 flows in the width direction of the vehicle.

Next, a process for assembling the high voltage electrical devices such as the battery 10 and the PDU 3 will be explained below with reference to FIGS. 10 to 14.

First, as shown in FIG. 10, the lower duct 51a of the first air flow duct 51 is attached from a lower position to the battery fixing portion 86 and the rising portions 88 of the frame 8. In this process, portions of the lower duct 51a where the engagement fingers 56 are elastically deformed inward in short side direction so that the engagement fingers 56 do not interfere with the frame 8. When the elastic deformation is released, the engagement fingers 56 engage the upper surface of the frame 8 so that the lower duct 51a is prevented from coming-off downward from the frame 8.

Figure 11:
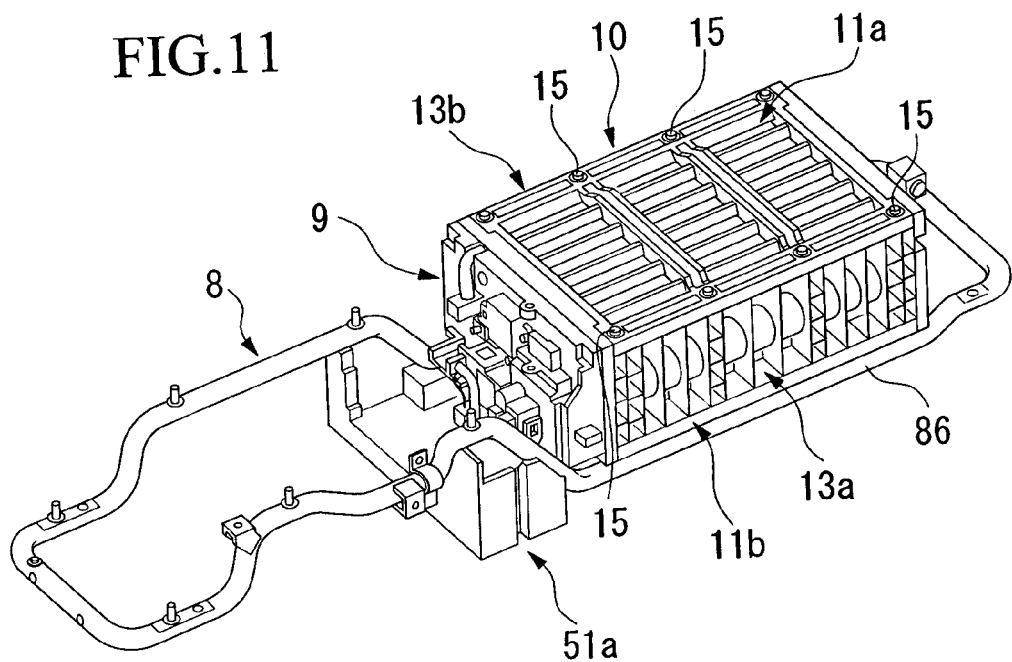
FIG. 11 is a perspective view showing a state, following the state shown in FIG. 10, in which the battery is fixed to the frame.

Next, as shown in FIG. 11, the battery 10, to which the battery protective function unit 9 is sub-assembled in advance, is mounted on the battery fixing portion 86, and is fixed to the frame 8 using threads. In this process, the front surface portion 13a and the rear surface portion 13b of the battery 10 and the upper surface portion 11a and the lower surface portion 11b of the battery 10 are fixed to the frame 8 in a co-tightening manner by bolts 15.

Figure 12:
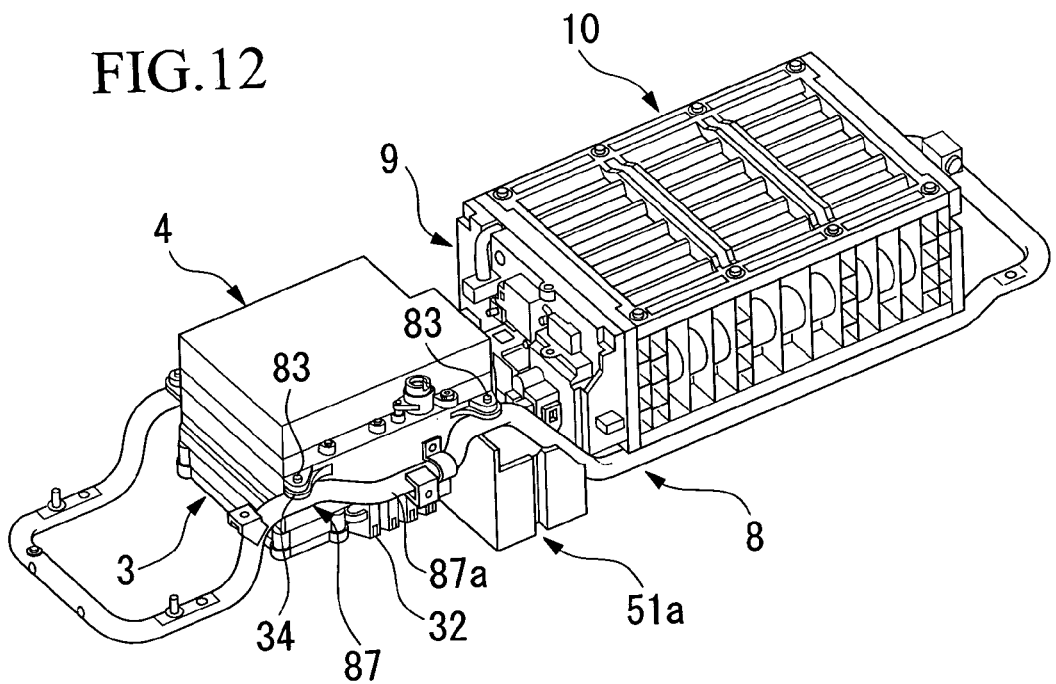
FIG. 12 is a perspective view showing a state, following the state shown in FIG. 11, in which the PDU and the DC/DC converter are fixed to the frame.

Next, as shown in FIG. 12, the PDU 3 is inserted from an upper position between the PDU fixing portions 87 in an orientation in which the heat sink 31 faces upward (FIG. 9), and the PDU 3 is mounted on the frame 8 by inserting the male threads 83 formed on the PDU fixing portions 87 into the insertion holes 33 of the flanges 34. in this process, because the frame 8 has the expanding portion 87a which expands outward in the short side direction, the terminal fixing portion. 32 which projects from the PDU 3 does not interfere with the frame 8. On the other hand, in a manner similar to the PDU 3, the DC/DC converter 4 is mounted on the frame 8 in an orientation in which the heat sink 41 faces downward (FIG. 8)

Through the above processes, the PDU 3 and the DC/DC converter 4 are placed in a state in which the respective heat sinks 31 and 41 face each other while having a gap therebetween.

Figure 7:
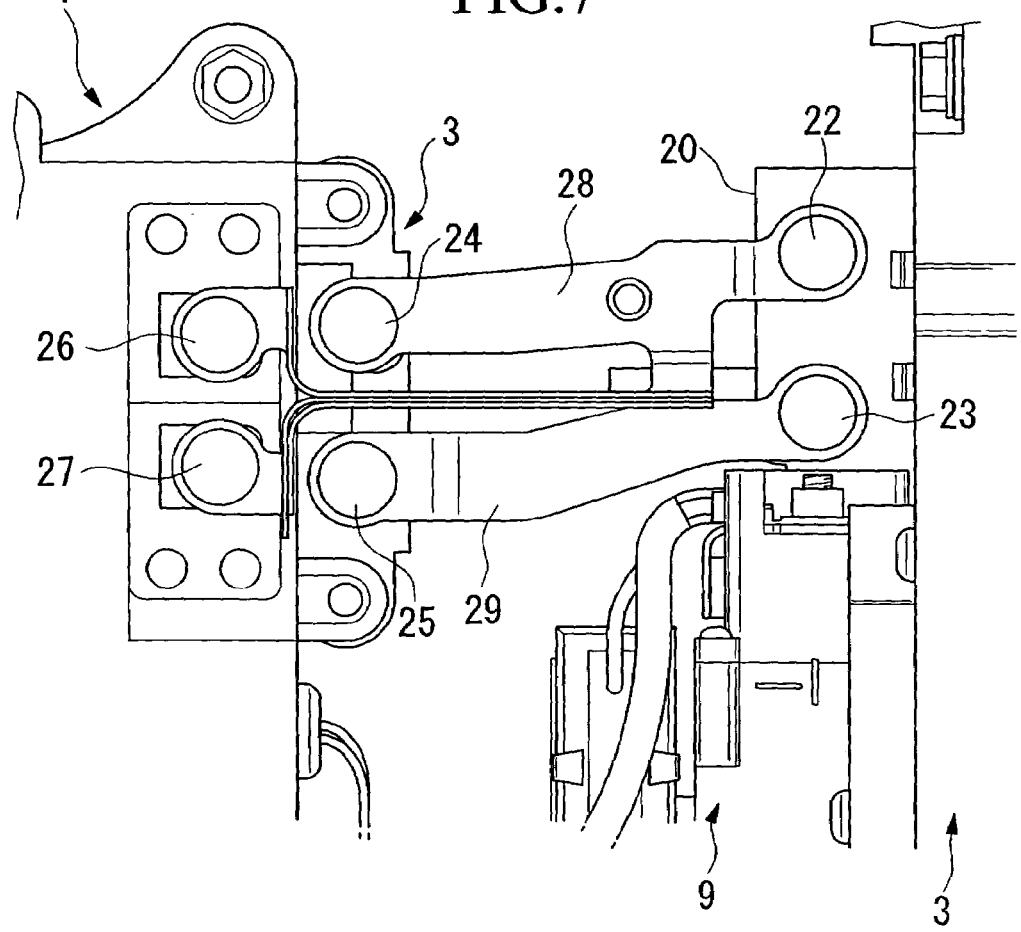
FIG. 7 is a diagram showing a connection state of bus-plate.

Next, the PDU and the DC/DC converter 4 are co-tightened to the frame 8 by engaging nuts with the male threads 83 of the PDU fixing portions 87. Consequently, the terminals 22 and 23 of the battery 10 (of the base plate 20) and the terminals 24 to 27 of the PDU 3 and the DC/DC converter 4 are connected to each other by the bus-plates 28 and 29 (FIG. 7).

The mounting process for the PDU 3 and the DC/DC converter 4 and the mounting process for the battery 10 may be inverted compared with the above-mentioned processes.

Figure 13:
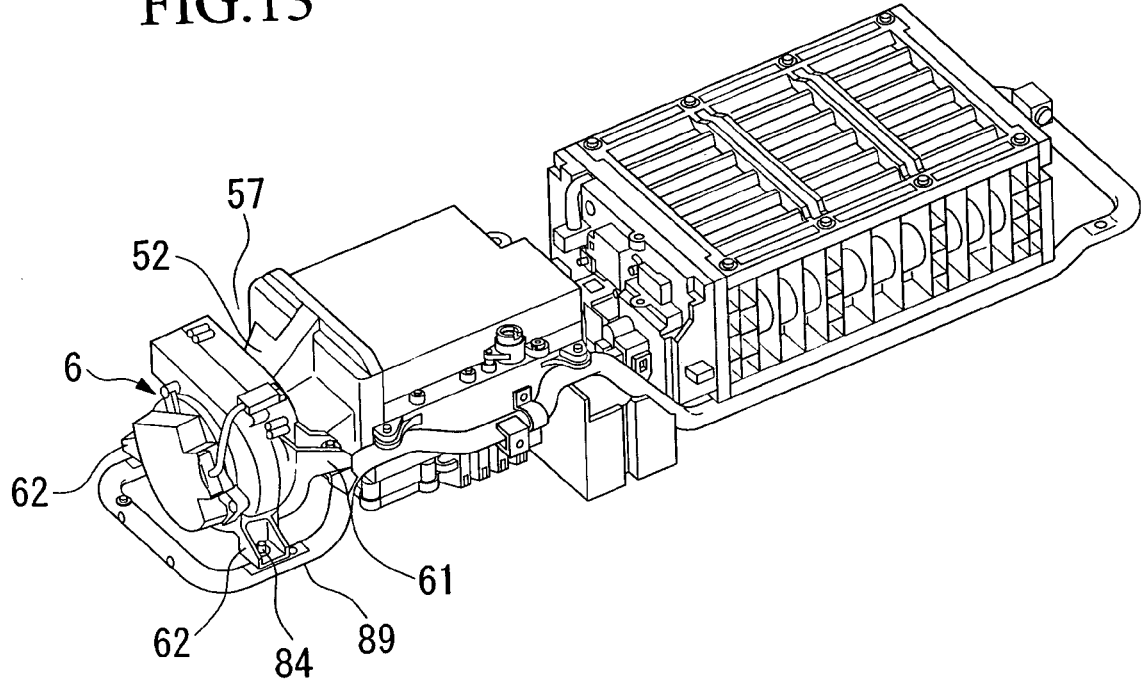
FIG. 13 is a perspective view showing a state, following the state shown in FIG. 12, in which a fan and a second duct are fixed to the frame.

Next, as shown in FIG. 13, the fan 6 is mounted on and fixed to the fan fixing portion 89 via two brackets 61 which are provided at an upper portion of the fan 6 and two brackets 62 which are provided at a lower portion of the fan 6, in each of which a bolt insertion hole is formed. It is preferable that anti-vibration rubber mountings be attached to the male threads 84 of the fan fixing portion 89 in advance.

Next, the second air flow duct 52 is disposed in a gap portion 57 between the suction side of the fan 6 and downstream side (the left side in the figure) of the heat sink of the PDU 3 and the DC/DC converter 4, so that there is a flow path for allowing cooling air to flow from the PDU 3 and the DC/DC converter 4 to the fan 6.

Figure 14:
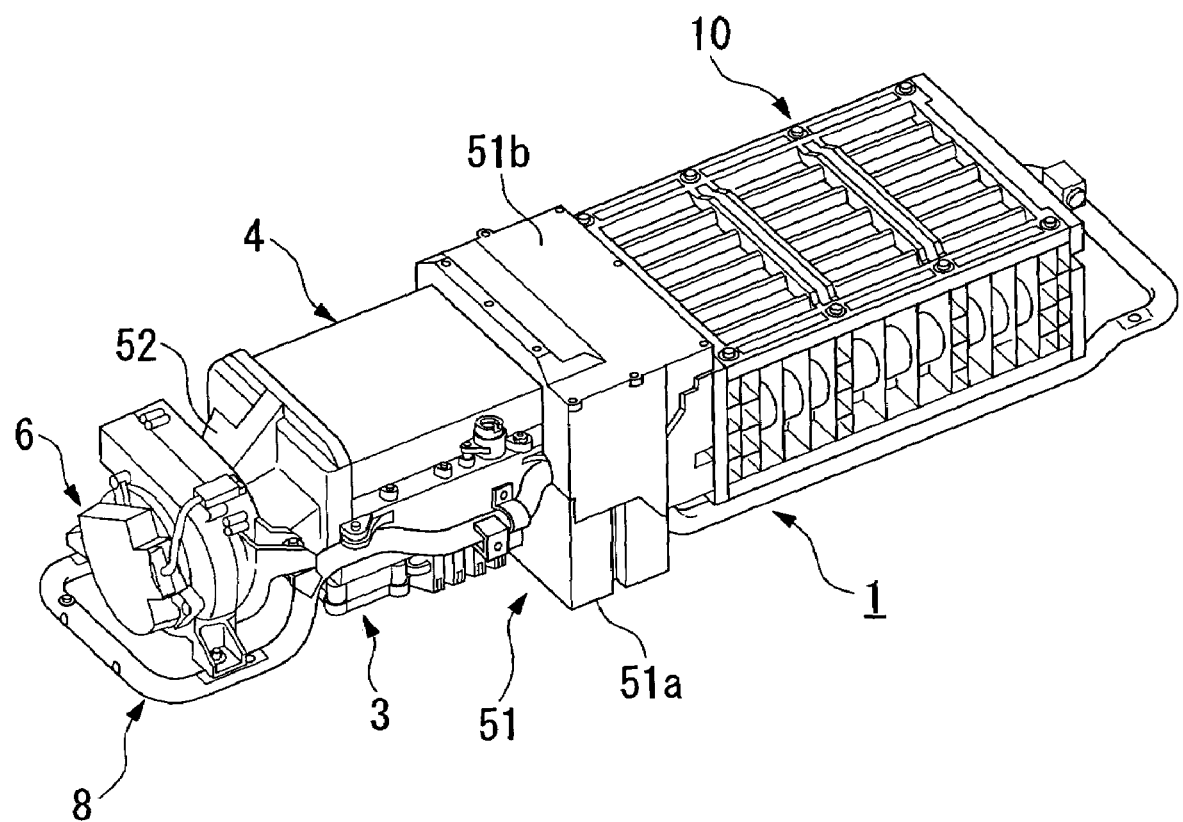
FIG. 14 is a perspective view showing a state, following the state shown in FIG. 13, in which an upper duct is fixed to the frame.

Consequently, as shown in FIG. 14, the upper duct 51b of the first air flow duct 51 is connected to the lower duct 51a, and then the upper duct 51b and the lower duct 51a are fixed to the frame 8 using bolts.

Figure 3:
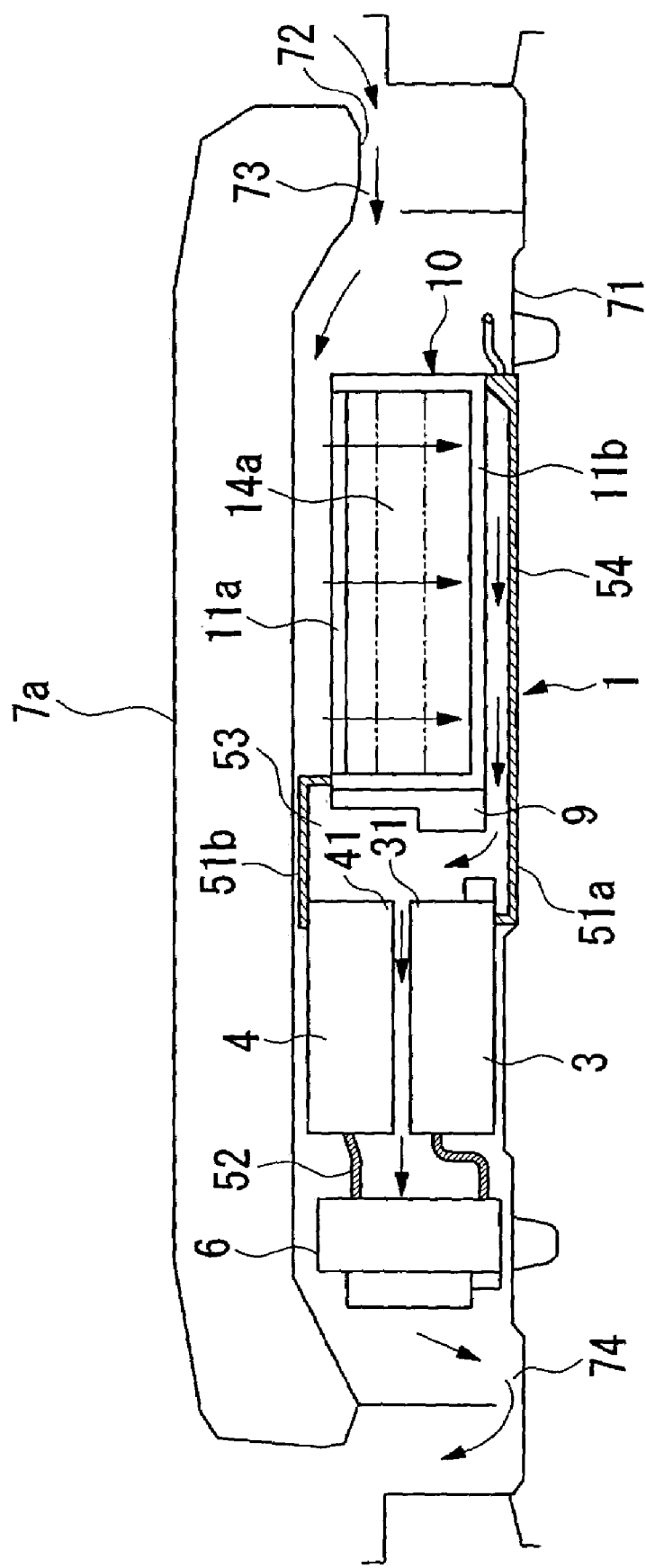
FIG. 3 is a diagram showing a flow state of cooling air in the cooling device for a high voltage electrical unit.

The cooling device 1 for a high voltage electrical unit in which the high voltage electrical devices such as the battery 10 and the PDU 3 are integrally fixed to the frame 8 assembled as explained above is fixed to the vehicle body 71 using threads at a location, for example, under a seat cushion 7a of the rear seat 7 in an orientation in which the longitudinal direction of the cooling device 1 for a high voltage electrical unit coincides with the width direction of the vehicle, as shown in FIG. 3. At this stage, a cooling air inlet 73 is formed under the rear seat 7 and at an end of the rear seat 7 as viewed in the width direction of the vehicle (the right position in FIG. 3), i.e., between the vehicle body 71 and an end portion of a lower surface 72 of the seat cushion 7a as viewed in the width direction of the vehicle, and a cooling air outlet 74 is formed under the rear seat 7 and at the other end of the rear seat 7 as viewed in the width direction of the vehicle, i.e., between the vehicle body 71 and the other end portion of the lower surface 72 of the seat cushion 7a as viewed in the width direction of the vehicle.

When the fan 6 rotates, as indicated by the arrows in FIG. 3, the cooling air in the passenger compartment flows from the cooling air inlet 73 formed under the seat cushion 7a and at an end of the seat cushion 7a into a gap between the upper surface of the battery 10 and the lower surface 72 of the seat cushion 7a, and flows to the battery 10 through the air flow apertures 18 formed in the upper surface portion 11a of the battery 10. The cooling air mainly flows downward in the battery 10, and flows out to the lower portion 54 of the first air flow duct 51 through the air flow apertures 18 formed in the lower surface portion 11b. The cooling air having flowed out to the lower portion 54 further flows along the longitudinal direction of the cooling device 1 for a high voltage electrical unit so as to pass through the first air flow duct 51, the heat sink 31 of the PDU 3, the heat sink 41 of the DC/DC converter 4, the second air flow duct 52, and the fan 6, and then is discharged into the luggage compartment through the cooling air outlet 74 formed under the seat cushion 7a.

In other words, when the cooling air flows in the above-mentioned sequence, the battery 10, the battery protective function unit 9 accommodated in the first air flow duct 51, the PDU 3, and the DC/DC converter 4 are cooled via heat exchange between the flowing cooling air and the heat sinks 31 and 41. In this cooling process, the battery 10, whose control temperature is relatively low among those of the high voltage electrical devices such as the battery 10 and the PDU 3 which are disposed in a concentrated manner, is first cooled, and then the PDU 3 and the DC/DC converter 4, which tend to have a temperature higher than the control temperature of the battery 10, are cooled at one time; therefore, efficiency of heat exchange can be improved.

As explained above, according to the cooling device 1 for a high voltage electrical unit in this embodiment, because the gap between the high voltage electrical devices and the lower surface of the seat is used as a duct without providing a duct at a suction portion for the cooling air, the number of the parts, size, and weight can be reduced.

Moreover, because the high voltage electrical devices such as the battery 10, which is a high voltage power source, and the PDU, are disposed, with the fan 6, on the single frame 8 in a concentrated manner, the cooling systems can be unified, and thus a lower cost can be achieved.

Furthermore, because all of the various high voltage electrical devices with the frame 8 can be installed on the vehicle body 71 at one time, and in addition, the installation operation can be performed just by placing from an upper position, installation efficiency can be significantly improved.

Moreover, because the first air flow duct 51 is provided so as to surround the gap portion 53 between the PDU 3 and the DC/DC converter 4, not only is it possible to efficiently cool down the battery protective function unit 9, the battery ECU 21, etc. disposed in the gap portion 53, but also the length of the duct can be reduced since the duct does not have to detour around these elements. As a result, it is possible to dispose the battery and the PDU 3 and DC/DC converter 4 so as to be close each other, the lengths of the bus-plates 28 and 29 can be minimized, and inductance and resistance can be reduced.

Moreover, because the high voltage electrical devices which are disposed in a concentrated manner under the seat, a structure in which the seatback 7b of the rear seat 7 is optionally tilted down (a so-called trunk-through configuration) can be employed, degradation of utility can be avoided. In addition, because the high voltage electrical devices are not disposed in the luggage compartment or under the floor, a luggage compartment and a leg room of sufficient size can be ensured.

Furthermore, because the high voltage electrical devices disposed in the passenger compartment, the upper surfaces of the seats will not be located at a high position, and the passenger will not feel that there is a lack of head clearance even though a minimum ground clearance is ensured.

In addition, because the electrical lines from the motor 2 disposed at a rear portion of the vehicle to the high voltage electrical unit including such as PDU 3 may be made short, energy loss and the cost can be reduced.

Moreover, because the cooling device 1 for a high voltage electrical unit is installed under the rear seat 7 in this embodiment, limitation due to type of the vehicle will not be applied to the installation position, and such an embodiment is applicable to various types of vehicles such as 2-door vehicles, 3-door vehicles, 4-door vehicles, 5-door vehicles, minivans, hatchback type vehicles, 2-seated vehicles, etc.

Figure 15:
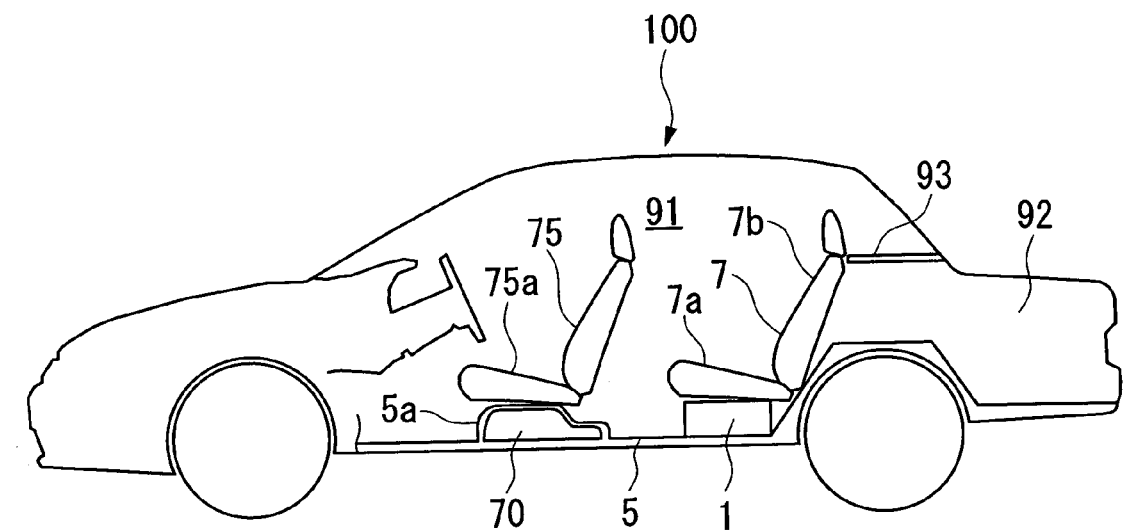
FIG. 15 is a schematic perspective view showing a seatback of a rear seat in an upright position in an embodiment of a hybrid vehicle including the cooling device for a high voltage electrical unit of the present invention.
Figure 16:
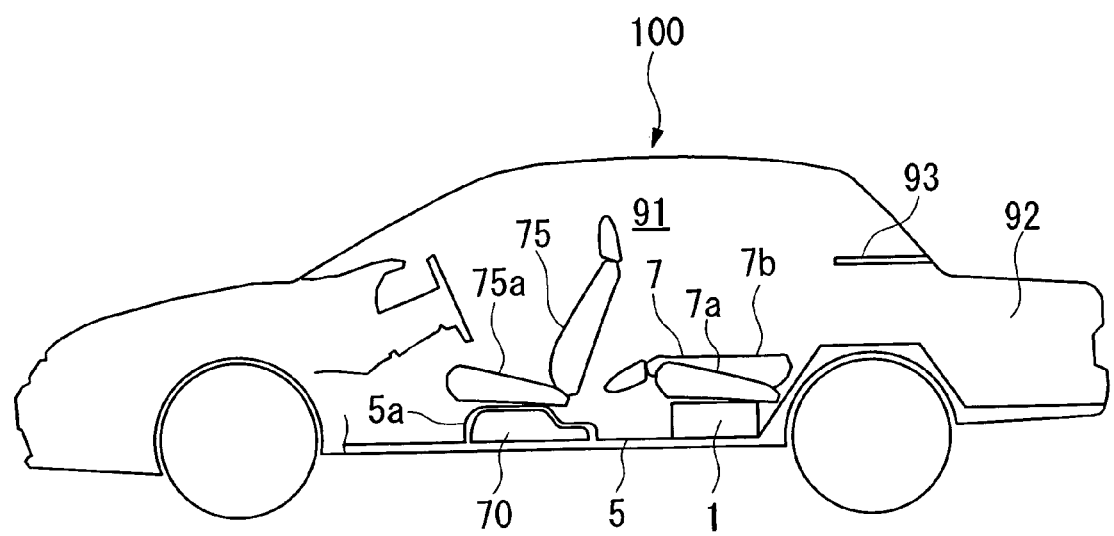
FIG. 16 is a schematic perspective view showing the seatback of the rear seat in a tilted down position in the embodiment of the hybrid vehicle.

FIGS. 15 and 16 are perspective views showing the schematic structure of a hybrid vehicle according to another embodiment. The hybrid vehicle 100 in this embodiment is, as in the aforementioned embodiment, a hybrid vehicle which is driven by transmitting at least one of driving powers of an engine and a motor (not shown) to driving wheels of the vehicle.

In the hybrid vehicle 100, a portion of a floor panel 5 located under a seat cushion 75a of a front seat 75 projects upward as a projected portion 5a, and a fuel tank 70 for storing fuel (e.g., gasoline) for the engine is disposed under the projected portion 5a. In other words, the fuel tank 70 is disposed under the front seat 75.

On the other hand, the cooling device 1 for a high voltage electrical unit is disposed under the seat cushion 7a of the rear seat 7. The cooling device 1 for a high voltage electrical unit is the same one as in the aforementioned embodiment; therefore, the detailed explanation thereof is omitted.

The seatback 7b of the rear seat 7 is made to be optionally tilted down. As shown in FIG. 15, the seatback 7b is in an upright position, an upper portion of the seatback 7b abuts against a rear shelf 93. In this state, the seatback 7b separates a front side passenger compartment 91 from a rear side luggage compartment 92.

In the hybrid vehicle 100 constructed as described above, when the seatback 7b of the rear seat 7 is tilted down so as to be disposed on the seat cushion 7a as shown in FIG. 16, the passenger compartment 91 and the luggage compartment 92 are connected to each other, i.e., a so-called trunk-through configuration is achieved; therefore, ease of using the passenger compartment 91 and the luggage compartment 92 is enhanced.

While preferred embodiments of the invention have been described and illustrated above, it should be understood that these are exemplary of the invention and are not to be considered as limiting. Additions, omissions, substitutions, and other modifications can be made without departing from the spirit or scope of the present invention.

For example, in the above embodiments, the cooling device 1 for a high voltage electrical unit is disposed under the rear seat 7; however, as indicated by a two-dot chain line in FIG. 1, the cooling device 1 may be disposed under the front seat 75.

The invention is not to be considered as being limited by the foregoing description, and is only limited by the scope of the appended claims.

What is claimed is:

1. A cooling device for a high voltage electrical unit for a motor of a vehicle, comprising:
    an inverter for controlling the motor that drives the vehicle;
    an electrical energy storing device for supplying electrical energy to the motor via the inverter;
    a downverter for decreasing source voltage of the electrical energy storing device, the downverter, the inverter, and the electrical energy storing device disposed under a seat of the vehicle in a concentrated manner;
    a fan, disposed under the seat, for moving cooling air to the electrical energy storing device and the inverter;
    an air inlet disposed under the seat and at an end of the seat as viewed in a width direction of the vehicle; and
    an air outlet disposed under the seat and at the other end of the seat as viewed in a width direction of the vehicle.

2. A cooling device according to claim 1, further comprising:
    a first heat sink fixed to the inverter; and
    a second heat sink fixed to the downverter, and disposed so as to oppose the first heat sink,
    wherein the electrical energy storing device is disposed upstream of a cooling air flow, and the inverter and the downverter are disposed downstream of the cooling air flow.

3. A cooling device according to claim 2,
    wherein the electrical energy storing device comprises modules which comprise electrical energy storing modules which are disposed in parallel while having gaps therebetween, and each of which comprises cells connected in series, and air flow apertures disposed above and below the modules, and
    wherein the cooling device further comprises an air flow duct for allowing cooling air to flow from one of the air flow apertures to the first heat sink and the second heat sink, and the air flow duct is formed by connecting an upper duct and a lower duct.

4. A cooling device according to claim 1, wherein the electrical energy storing device, the inverter, the downverter, and the fan are integrally fixed to a single loop-shaped frame.

5. A cooling device according to claim 4,
    wherein the electrical energy storing device comprises: air flow aperture panels which are disposed at an upper portion and lower portion thereof; modules which comprise electrical energy storing modules which are disposed in parallel while having gaps therebetween, and each of which comprises cells connected in series; and side retaining panels which retain side surfaces of the modules, and
    wherein the air flow aperture panels and the side retaining panels are fixed to the frame by co-tightening.

6. A cooling device according to claim 4, wherein the frame comprises a first fixing portion by which the frame is fixed to body of the vehicle, and a second fixing portion by which the electrical energy storing device, the inverter, the downverter, and the fan are fixed to the frame.

7. A cooling device according to claim 4, further comprising:
    a first heat sink fixed to the inverter; and
    a second heat sink fixed to the downverter, and disposed so as to oppose the first heat sink,
    wherein the frame is routed through a position under the electrical energy storing device, side positions of the first heat sink and the second heat sink, and a position under the fan.

8. A cooling device according to claim 1, wherein terminals of the downverter and terminals of the electrical energy storing device are disposed close to each other, and the terminals are connected to each other via a plate-shaped conductive member.

9. A hybrid vehicle which is driven by transmitting at least one of driving powers of an engine and a motor to driving wheels, the hybrid vehicle comprising:
    a fuel tank, disposed under a front seat of the hybrid vehicle, for storing fuel to be supplied to the engine; and
    the cooling device for a high voltage electrical unit for a motor of a vehicle according to claim 1, which is disposed under a rear seat of the hybrid vehicle.

* * * * *